(12) United States Patent
Escamilla et al.

(10) Patent No.: US 12,219,726 B2
(45) Date of Patent: Feb. 4, 2025

(54) DETENT FOR RETENTION OF INFORMATION HANDLING RESOURCE

(71) Applicant: Dell Products L.P., Round Rock, TX (US)

(72) Inventors: Eduardo Escamilla, Round Rock, TX (US); Gilberto Hernandez, Pharr, TX (US)

(73) Assignee: Dell Products L.P., Round Rock, TX (US)

( * ) Notice: Subject to any disclaimer, the term of this patent is extended or adjusted under 35 U.S.C. 154(b) by 278 days.

(21) Appl. No.: 17/890,419

(22) Filed: Aug. 18, 2022

(65) Prior Publication Data

US 2024/0064918 A1 Feb. 22, 2024

(51) Int. Cl.
*H05K 7/14* (2006.01)
*G06F 1/18* (2006.01)

(52) U.S. Cl.
CPC .......... *H05K 7/1402* (2013.01); *G06F 1/185* (2013.01); *H05K 7/1431* (2013.01)

(58) Field of Classification Search
CPC .... G06F 1/185; H05K 7/1402; H05K 7/1431; H05K 7/1424; H05K 7/1407
See application file for complete search history.

(56) References Cited

U.S. PATENT DOCUMENTS 11,269,385 B2 *   3/2022   Chang .................... G06F 1/185

* cited by examiner

*Primary Examiner* — James Wu
(74) *Attorney, Agent, or Firm* — Jackson Walker L.L.P.

(57) ABSTRACT

A card may include a circuit board, a cable configured to communicatively couple the circuit board to a motherboard, a connector configured to receive an expansion card to communicatively couple the expansion card to the motherboard, and a detent assembly configured to mechanically couple the card to the motherboard. The detent assembly may include a pin mechanically coupled to a surface of the circuit board and extending from the surface of the circuit board and configured to mechanically engage with a first feature of the mechanical post in order to align the card to the motherboard and a detent mechanically coupled to the pin and having an annular shape, the detent configured to mechanically engage with a second feature of the mechanical post in order to mechanically retain the card with the motherboard.

17 Claims, 5 Drawing Sheets

DETENT FOR RETENTION OF INFORMATION HANDLING RESOURCE

TECHNICAL FIELD

The present disclosure relates in general to information handling systems, and more particularly to systems and methods for mechanical retention of an information handling resource, such as a riser, to another information handling resource in an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems often employ riser cards, which may also be known as simply "risers." A riser card may be a printed circuit board configured to be coupled to a motherboard and further configured to receive one or more other expansion cards, thus providing an option for additional expansion cards to be communicatively coupled to the motherboard.

Historically, risers have been coupled to motherboards via an edge connector of the risers configured to couple to corresponding receptacle connectors of motherboards. However, as signal speeds have increased from generation to generation, edge connectors may not provide required signal integrity, and increasingly, the trend has been towards coupling risers to motherboards via a cable.

However, due to stiffness of cables for coupling risers to motherboards, mechanical retention of risers to motherboards are often needed to mitigate cable forces that may lift the riser. Traditionally, risers have been mechanically locked in place via finger-actuated latches, limiting configuration flexibility and airflow optimization.

SUMMARY

In accordance with the teachings of the present disclosure, the disadvantages and problems associated with existing approaches to mechanically retaining a riser card assembly to a motherboard may be reduced or eliminated.

In accordance with embodiments of the present disclosure, an information handling system may include a motherboard comprising a mechanical post extending from a surface of the motherboard and a riser card. The riser card assembly may include a circuit board, a cable configured to communicatively couple the circuit board to the motherboard, a connector configured to receive an expansion card to communicatively couple the expansion card to the motherboard, and a detent assembly configured to mechanically couple the riser card assembly to the motherboard. The detent assembly may include a pin mechanically coupled to a surface of the riser card assembly and extending from the surface of the circuit board and configured to mechanically engage with a first feature of the mechanical post in order to align the riser card assembly to the motherboard and a detent mechanically coupled to the pin and having an annular shape, the detent configured to mechanically engage with a second feature of the mechanical post in order to mechanically retain the riser card assembly with the motherboard.

In accordance with these and other embodiments of the present disclosure, a riser card assembly may include a circuit board, a cable configured to communicatively couple the circuit board to a motherboard, a connector configured to receive an expansion card to communicatively couple the expansion card to the motherboard, and a detent assembly configured to mechanically couple the riser card assembly to the motherboard. The detent assembly may include a pin mechanically coupled to a surface of the riser card assembly and extending from the surface of the riser card assembly and configured to mechanically engage with a first feature of the mechanical post in order to align the riser card assembly to the motherboard and a detent mechanically coupled to the pin and having an annular shape, the detent configured to mechanically engage with a second feature of the mechanical post in order to mechanically retain the riser card assembly with the motherboard.

In accordance with these and other embodiments of the present disclosure, a detent assembly configured to mechanically couple a first mechanical member to a second mechanical member may include a pin mechanically coupled to a surface of the first mechanical member and extending from the surface of the first mechanical member and configured to mechanically engage with a first feature of a mechanical post of the second mechanical member in order to align the first mechanical member to the second mechanical member and a detent mechanically coupled to the pin and having an annular shape, the detent configured to mechanically engage with a second feature of the mechanical post in order to mechanically retain the first mechanical member with the second mechanical member.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 4B, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU"), microcontroller, or hardware or software control logic. Additional components of the information handling system may include one or more storage one devices, or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

For the purposes of this disclosure, circuit boards may broadly refer to printed circuit boards (PCBs), printed wiring boards (PWBs), printed wiring assemblies (PWAs), etched wiring boards, and/or any other board or similar physical structure operable to mechanically support and electrically couple electronic components (e.g., packaged integrated circuits, slot connectors, etc.). A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

Figure 1:
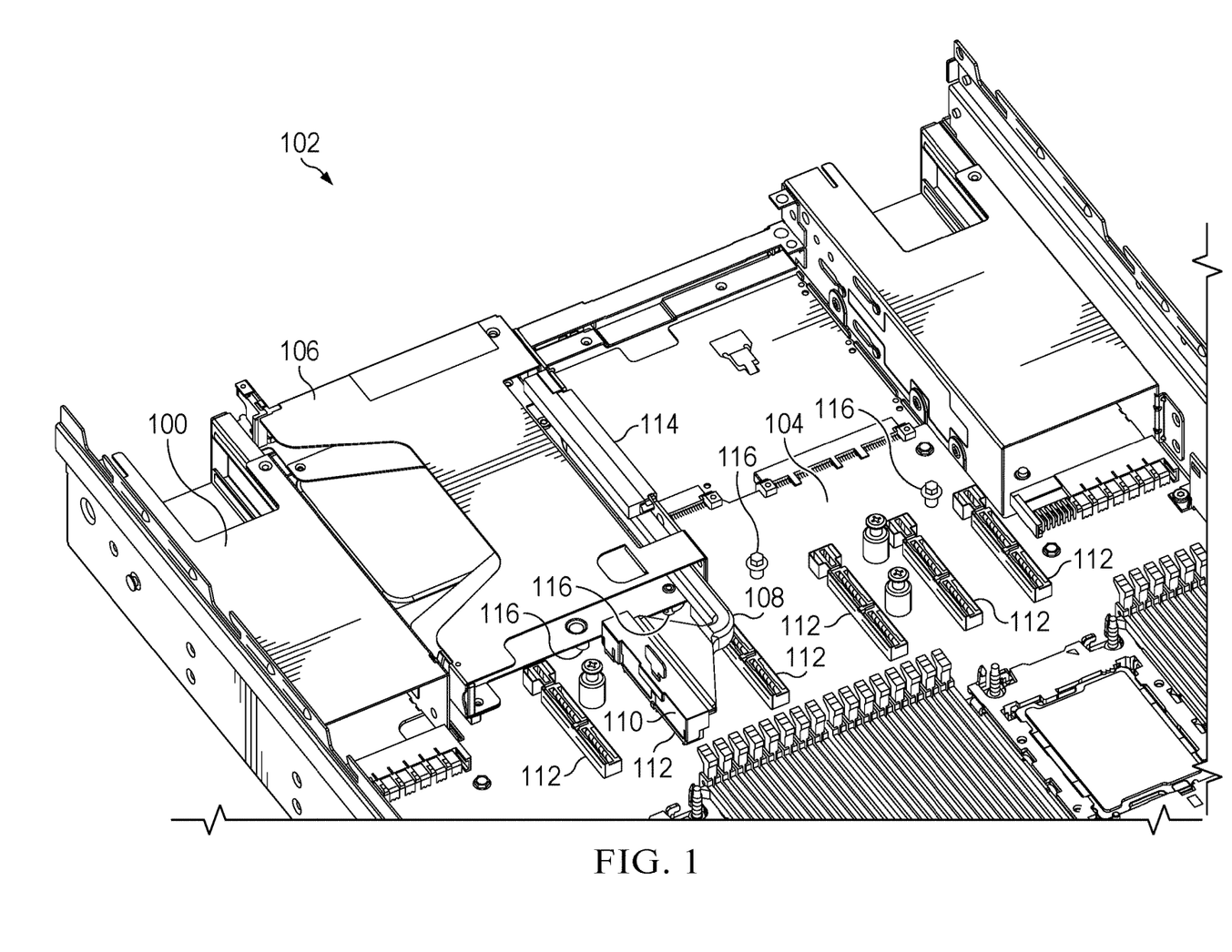
FIG. 1 illustrates a perspective view of selected components of an example information handling system, in accordance with embodiments of the present disclosure.

FIG. 1 illustrates a perspective view of selected components of an example information handling system 102, in accordance with embodiments of the present disclosure. As shown in FIG. 1, information handling system 102 may comprise a chassis 100 that may comprise an enclosure that serves as a container for various information handling resources of information handling system 102, and may be constructed from steel, aluminum, plastic, and/or any other suitable material. Although the term "chassis" is used, chassis 100 may also be referred to as a case, enclosure, and/or housing.

As also shown in FIG. 1, chassis 100 may house information handling resources, including without limitation a motherboard 104 and a riser card assembly 106. Riser card assembly 106 may communicatively couple to motherboard 104 via a cable 108 terminated with a connector 110, wherein such connector 110 may be configured to couple to a corresponding connector 112 of motherboard 104. Further, riser card assembly 106 may include a receptacle connector 114 for mechanically and communicatively coupling an expansion card to riser card assembly 106, in order to communicatively couple such expansion card to motherboard 104.

As further shown in FIG. 1, motherboard 104 may include one or more mechanical retention posts 116, wherein each mechanical retention post 116 is configured to mechanically engage with a corresponding mechanical feature of riser card assembly 106 in order to mechanically retain riser card assembly 106 to motherboard 104. In some embodiments, a size, a shape, a placement, and/or other features of each mechanical retention post 116 may be defined by a standard, such as the Open Compute Project (OCP), for example. In particular, the mechanical feature of riser card assembly 106 may include a detent assembly as described in greater detail in FIGS. 2 through 4B below, and which is not visible in FIG. 1 as such detent assembly may be located beneath riser card assembly 106 in the perspective shown.

Figure 2:
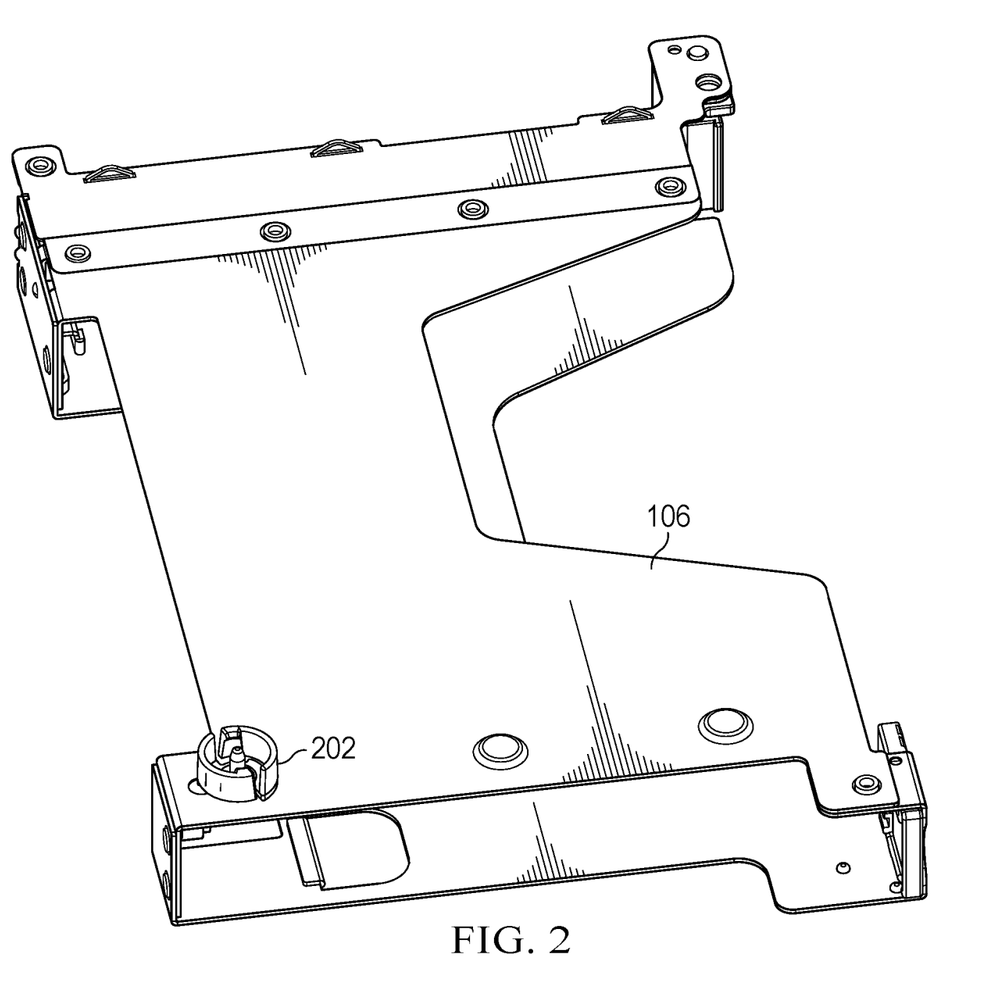
FIG. 2 illustrates a perspective view of selected components of an example riser card assembly, in accordance with embodiments of the present disclosure.

FIG. 2 illustrates a perspective view of selected components of an example riser card assembly 106, in accordance with embodiments of the present disclosure. In particular, FIG. 2 depicts the opposite side of riser card assembly 106 than that shown in FIG. 1. As shown in FIG. 2, riser card assembly 106 may include a detent assembly 202 mechanically coupled to one side of riser card assembly 106. Although, for purposes of clarity and exposition, FIG. 2 depicts riser card assembly 106 as having a single detent assembly 202, in some embodiments, riser card assembly 106 may include a plurality of detent assemblies 202.

Figure 3:
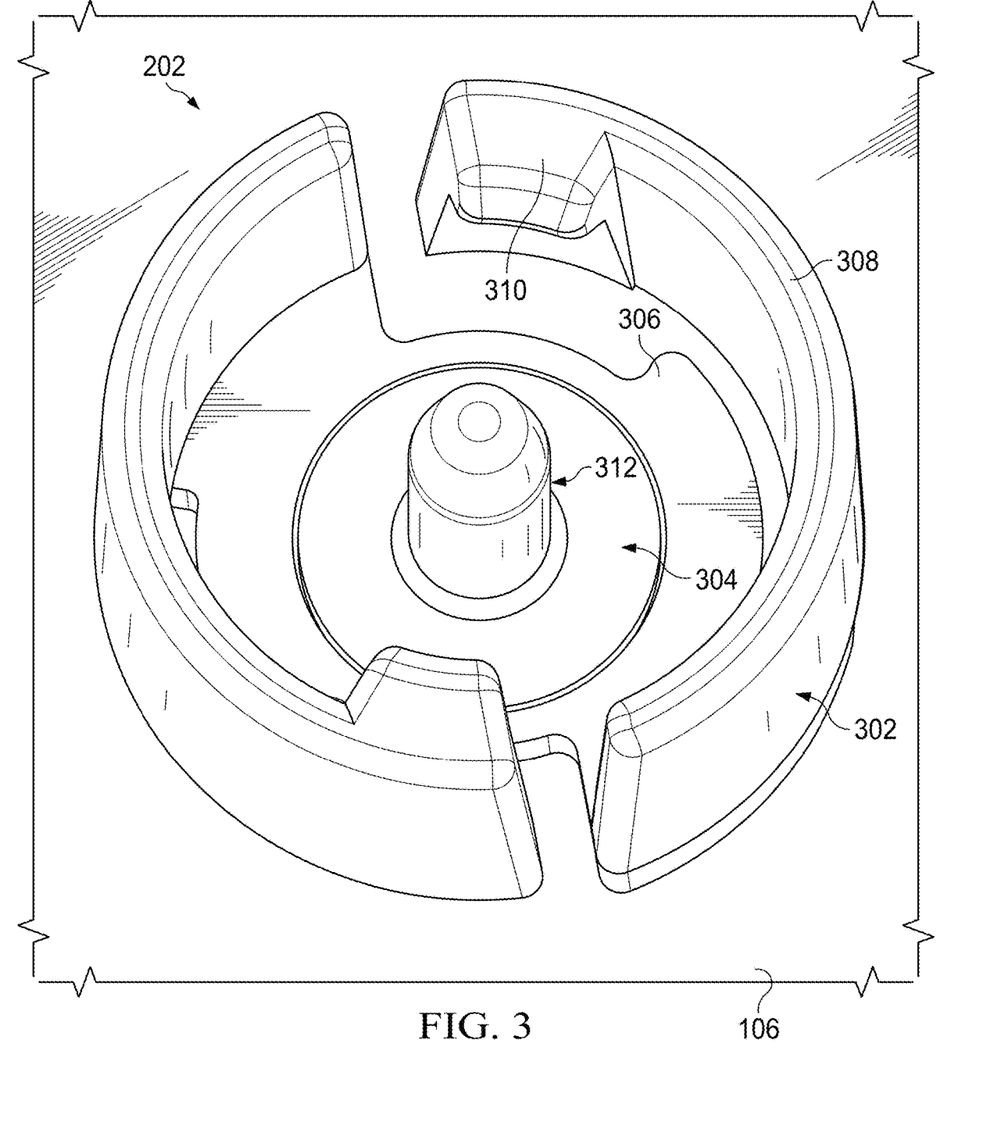
FIG. 3 illustrates a perspective view of an example detent assembly of a riser card assembly, in accordance with embodiments of the present disclosure.

FIG. 3 illustrates a perspective view of an example detent assembly 202 of a riser card assembly 106, in accordance with embodiments of the present disclosure. As shown in FIG. 3, detent assembly 202 may include a detent 302 mechanically coupled to riser card assembly 106 via pin 304. Detent 302 may include a base 306 in proximity to a side of riser card assembly 106 and generally circular in shape with certain portions of such circle missing, and wherein surfaces of such circle are generally parallel to the side of riser card assembly 106 to which detent assembly 202 is mechanically coupled. Extending from base 306 may be one or more retention arms 308, each retention arm 308 extending from base 306 in a direction perpendicular to the surfaces of base 306 (i.e., extending away from the side of riser card assembly 106 to which detent assembly 202 is mechanically coupled) and each retention arm 308 having an annular shape that is generally concentric with the generally circular shape defined by base 306. Each retention arm 308 may extend in such annular path towards an adjacent retention arm 308, with a small gap present between adjacent retention arms 308. Thus, with the exception of a portion of the certain portions missing from the circular shape defined by base 306 and in the absence of the small gaps between adjacent retention arms 308, detent 302 may be in a generally cylindrical shape, such cylinder having a bottom (e.g., base 306) and an open top, with pin 304 surrounded by the partial annular walls defined by retention arms 308. Further, each retention arm 308 may include a tab 310 extending from such retention arm 308 in a direction generally parallel to that of the surface of base 306. Detent 302 may be formed from a flexible solid material that permits retention arms 308 to bend or deform relative to base 306 while being biased into a particular position relative to base 306 due to a mechanical spring force between retention arms 308 and base 306.

As also shown in FIG. 3, pin 304 may include an alignment feature 312 that may extend from base 306 in a generally perpendicular direction to that of the generally circular shape defined by base 306.

Figure 4A:
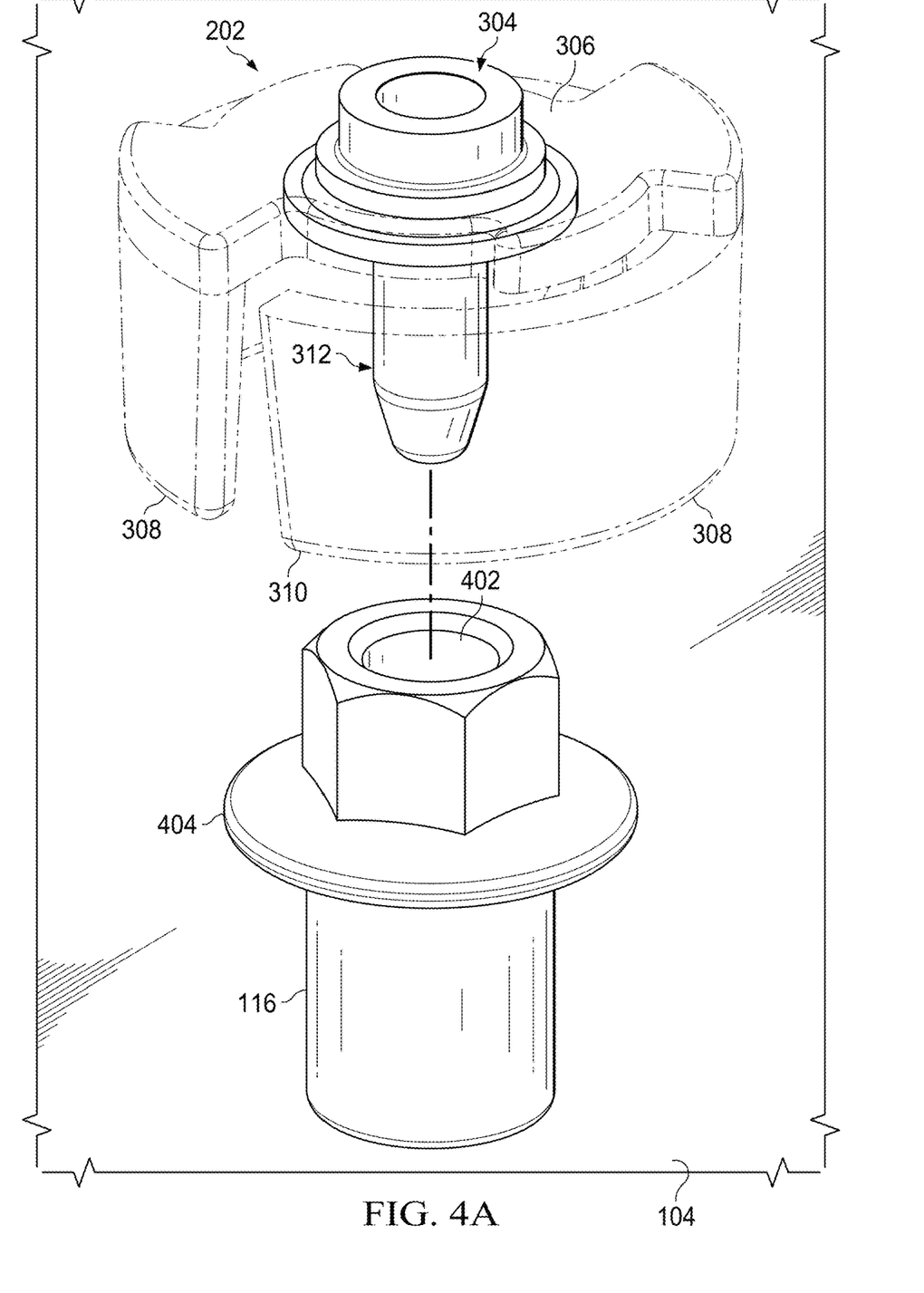
FIG. 4A illustrates a perspective view of a detent assembly prior to mechanical engagement with a post of a motherboard, in accordance with embodiments of the present disclosure.
Figure 4B:
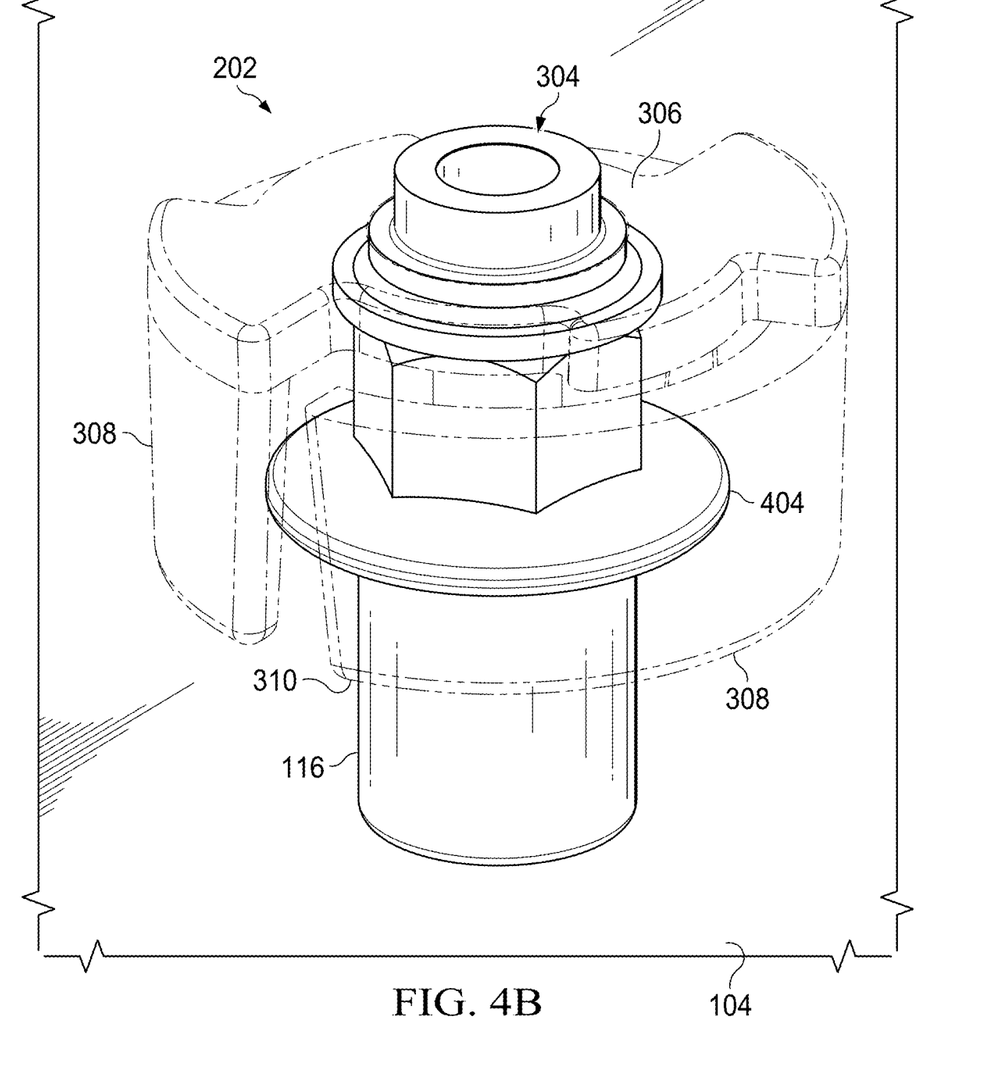
FIG. 4B illustrates a perspective view of a detent assembly mechanically engaged with a post of a motherboard, in accordance with embodiments of the present disclosure.

FIG. 4A illustrates a perspective view of detent assembly 202 prior to mechanical engagement with a post 116 of motherboard 104, in accordance with embodiments of the present disclosure. FIG. 4B illustrates a perspective view of detent assembly 202 mechanically engaged with a post 116 of motherboard 104, in accordance with embodiments of the present disclosure. For purposes of clarity and exposition, detent 302 is shown transparent in FIGS. 4A and 4B, and detent assembly 202 is depicted without riser card assembly 106.

As shown in FIGS. 4A and 4B, detent assembly 202 may be mechanically coupled to post 116 by aligning alignment feature 312 of pin 304 with a hole 402 formed in post 116 and applying a force between detent assembly 202 and post 116 in a direction generally co-linear with the length of alignment feature 312. Mechanical interaction of tabs 310 with a generally circular-shaped shelf 404 of post 116 may cause retention arms 308 to partially end relative to base 306 so that tabs 310 may pass over and then under shelf 404. Once a tab 310 is under shelf 404, its associated retention arm 308 may return to its original position relative to base 306, such that mechanical force between such tab 310 and the bottom of shelf 404 mechanically retains detent assembly 202 relative to post 116, and thus mechanically retains riser card assembly 106 to motherboard 104.

In accordance with embodiments of the present disclosure, a detent assembly (e.g., detent assembly 202) may be configured to mechanically couple a first mechanical member (e.g., riser card assembly 106) to a second mechanical member (e.g., motherboard 104), wherein the detent assembly may include a pin (e.g., pin 304) mechanically coupled to a surface of the first mechanical member (e.g., riser card assembly 106) and extending from the surface of the first mechanical member (e.g., riser card assembly 106) and configured to mechanically engage with a first feature (e.g., hole 402) of a mechanical post (e.g., post 116) of the second mechanical member (e.g., motherboard 104) in order to align (e.g., with alignment feature 312) the first mechanical member (e.g., riser card assembly 106) to the second mechanical member (e.g., motherboard 104). The detent assembly may also include a detent (e.g., detent 302) mechanically coupled to the pin (e.g., pin 304) and having an annular shape, the detent (e.g., detent 302) configured to mechanically engage with a second feature (e.g., shelf 404) of the mechanical post (e.g., post 116) in order to mechanically retain the first mechanical member (e.g., riser card assembly 106) with the second mechanical member (e.g., motherboard 104).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112 (f) unless the words "means for" or "step for" are explicitly used in the particular claim.

What is claimed is:

1. An information handling system, comprising:
    a motherboard comprising a mechanical post extending from a surface of the motherboard; and
    a riser card assembly comprising:
        a circuit board;
        a cable configured to communicatively couple the circuit board to the motherboard;
        a connector configured to receive an expansion card to communicatively couple the expansion card to the motherboard; and
        a detent assembly configured to mechanically couple the riser card assembly to the motherboard, the detent assembly comprising:
            a pin mechanically coupled to a surface of the riser card assembly and extending from the surface of the riser card assembly and configured to mechanically engage with a first feature of the mechanical post in order to align the riser card assembly to the motherboard; and
            a detent mechanically coupled to the pin and having an annular shape, the detent configured to mechanically engage with a second feature of the mechanical post in order to mechanically retain the riser card assembly with the motherboard.

2. The information handling system of claim 1, wherein a location of the mechanical post is defined by a standard.

3. The information handling system of claim 1, wherein:
    the first feature comprises a hole formed in the mechanical post; and
    the pin includes an alignment feature configured to engage with the hole in the mechanical post in order to align the riser card assembly to the motherboard.

4. The information handling system of claim 1, wherein the second feature comprises a shelf extending from a body of the mechanical post.

5. The information handling system of claim 4, wherein the detent comprises:
    a base having a generally circular shape with a surface generally in parallel with a surface of the riser card assembly;
    a plurality of retention arms extending away from the base in a direction perpendicular to the surface of the base and each retention arm of the plurality of retention arms having an annular shape that is generally concentric with the generally circular shape defined by the base; and
    a plurality of engagement features, each engagement feature extending from a corresponding extension arm in a direction generally parallel to the surface of the base and configured to engage with the shelf to mechanically retain the riser card assembly with the motherboard when the detent assembly is engaged with the mechanical post.

6. The information handling system of claim 5, wherein:
    the plurality of engagement features are biased in a first position relative to the base due to a spring force between the engagement features of the body; and
    the plurality of engagement features are configured to engage with the shelf to overcome the bias in the first position such that the engagement features move from a first side of the shelf to a second side of the shelf when the detent assembly is engaged with the mechanical post in order to mechanically retain the plurality of engagement features with the second side of the shelf to mechanically retain the riser card assembly with the motherboard.

7. A riser card assembly comprising:
    a circuit board;
    a cable configured to communicatively couple the circuit board to a motherboard;
    a connector configured to receive an expansion card to communicatively couple the expansion card to the motherboard; and
    a detent assembly configured to mechanically couple the riser card assembly to the motherboard, the detent assembly comprising:
        a pin mechanically coupled to a surface of the riser card assembly and extending from the surface of the riser card assembly and configured to mechanically engage with a first feature of a mechanical post in order to align the riser card assembly to the motherboard; and
        a detent mechanically coupled to the pin and having an annular shape, the detent configured to mechanically engage with a second feature of the mechanical post in order to mechanically retain the riser card assembly with the motherboard.

8. The riser card assembly of claim 7, wherein a location of the mechanical post is defined by a standard.

9. The riser card assembly of claim 7, wherein:
    the first feature comprises a hole formed in the mechanical post; and
    the pin includes an alignment feature configured to engage with the hole in the mechanical post in order to align the riser card assembly to the motherboard.

10. The riser card assembly of claim 7, wherein the second feature comprises a shelf extending from a body of the mechanical post.

11. The riser card assembly of claim 10, wherein the detent comprises:
    a base having a generally circular shape with a surface generally in parallel with a surface of the riser card assembly;
    a plurality of retention arms extending away from the base in a direction perpendicular to the surface of the base and each retention arm of the plurality of retention arms having an annular shape that is generally concentric with the generally circular shape defined by the base; and
    a plurality of engagement features, each engagement feature extending from a corresponding extension arm in a direction generally parallel to the surface of the base and configured to engage with the shelf to mechanically retain the riser card assembly with the motherboard when the detent assembly is engaged with the mechanical post.

12. The riser card assembly of claim 11, wherein:
the plurality of engagement features are biased in a first position relative to the base due to a spring force between the engagement features of the body; and
the plurality of engagement features are configured to engage with the shelf to overcome the bias in the first position such that the engagement features move from a first side of the shelf to a second side of the shelf when the detent assembly is engaged with the mechanical post in order to mechanically retain the plurality of engagement features with the second side of the shelf to mechanically retain the riser card assembly with the motherboard.

13. A detent assembly configured to mechanically couple a first mechanical member to a second mechanical member, the detent assembly comprising:
a pin mechanically coupled to a surface of the first mechanical member and extending from the surface of the first mechanical member and configured to mechanically engage with a first feature of a mechanical post of the second mechanical member in order to align the first mechanical member to the second mechanical member; and
a detent mechanically coupled to the pin and having an annular shape, the detent configured to mechanically engage with a second feature of the mechanical post in order to mechanically retain the first mechanical member with the second mechanical member.

14. The detent assembly of claim 13, wherein:
the first feature comprises a hole formed in the mechanical post; and
the pin includes an alignment feature configured to engage with the hole in the mechanical post in order to align the first mechanical member to the second mechanical member.

15. The detent assembly of claim 13, wherein the second feature comprises a shelf extending from a body of the mechanical post.

16. The detent assembly of claim 15, wherein the detent comprises:
a base having a generally circular shape with a surface generally in parallel with a surface of the first mechanical member;
a plurality of retention arms extending away from the base in a direction perpendicular to the surface of the base and each retention arm of the plurality of retention arms having an annular shape that is generally concentric with the generally circular shape defined by the base; and
a plurality of engagement features, each engagement feature extending from a corresponding extension arm in a direction generally parallel to the surface of the base and configured to engage with the shelf to mechanically retain the first mechanical member with the second mechanical member when the detent assembly is engaged with the mechanical post.

17. The detent assembly of claim 16, wherein:
the plurality of engagement features are biased in a first position relative to the base due to a spring force between the engagement features of the body; and
the plurality of engagement features are configured to engage with the shelf to overcome the bias in the first position such that the engagement features move from a first side of the shelf to a second side of the shelf when the detent assembly is engaged with the mechanical post in order to mechanically retain the plurality of engagement features with the second side of the shelf to mechanically retain the first mechanical member with the second mechanical member.

* * * * *